(12) United States Patent
Park et al.

(10) Patent No.: US 10,177,788 B2
(45) Date of Patent: *Jan. 8, 2019

(54) LOW DENSITY PARITY CHECK ENCODER HAVING LENGTH OF 64800 AND CODE RATE OF 2/15, AND LOW DENSITY PARITY CHECK ENCODING METHOD USING THE SAME

(71) Applicant: ELECTRONICS AND TELECOMMUNICATIONS RESEARCH INSTITUTE, Daejeon (KR)

(72) Inventors: Sung-Ik Park, Daejeon (KR); Heung-Mook Kim, Daejeon (KR); Sun-Hyoung Kwon, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/644,455

(22) Filed: Jul. 7, 2017

(65) Prior Publication Data

US 2017/0324426 A1 Nov. 9, 2017

Related U.S. Application Data

(63) Continuation of application No. 15/271,169, filed on Sep. 20, 2016, now Pat. No. 9,735,807, which is a
(Continued)

(30) Foreign Application Priority Data

Aug. 14, 2014 (KR) .................. 10-2014-0106178
Sep. 11, 2014 (KR) .................. 10-2014-0120012

(51) Int. Cl.
*H03M 13/11* (2006.01)
*H04L 1/00* (2006.01)
(Continued)

(52) U.S. Cl.
CPC .... *H03M 13/1177* (2013.01); *H03M 13/1102* (2013.01); *H03M 13/1105* (2013.01);
(Continued)

(58) Field of Classification Search
CPC .......... H03M 13/1177; H03M 13/116; H03M 13/1165; H03M 13/255; H03M 13/1185;
(Continued)

(56) References Cited

U.S. PATENT DOCUMENTS 9,225,358 B2 * 12/2015 Park ................ H03M 13/116
2008/0178065 A1 7/2008 Khandekar et al.
(Continued)

FOREIGN PATENT DOCUMENTS

KR 10-2007-0058438 A 6/2007
KR 10-2013-0135746 A 12/2013
WO WO 2006/001666 A2 1/2006

OTHER PUBLICATIONS

"Digital Video Broadcasting (DVB); Frame structure channel coding and modulation for a second generation digital terrestrial television broadcasting system (DVB-T2)", Final draft ETSI EN 302 755, Oct. 2010, pp. 1-177, VI.2.1., European Standard (Telecommunications Series).*
(Continued)

*Primary Examiner* — John J Tabone, Jr.

(57) ABSTRACT

A low density parity check (LDPC) encoder, an LDPC decoder, and an LDPC encoding method are disclosed. The LDPC encoder includes first memory, second memory, and a processor. The first memory stores an LDPC codeword having a length of 64800 and a code rate of 2/15. The second
(Continued)

memory is initialized to 0. The processor generates the LDPC codeword corresponding to information bits by performing accumulation with respect to the second memory using a sequence corresponding to a parity check matrix (PCM).

5 Claims, 5 Drawing Sheets

Related U.S. Application Data continuation of application No. 14/496,457, filed on Sep. 25, 2014, now Pat. No. 9,490,843.

(51) Int. Cl.
*H03M 13/00* (2006.01)
*H03M 13/25* (2006.01)

(52) U.S. Cl.
CPC ...... *H03M 13/116* (2013.01); *H03M 13/1165* (2013.01); *H03M 13/1185* (2013.01); *H03M 13/255* (2013.01); *H03M 13/616* (2013.01); *H04L 1/0057* (2013.01); *H03M 13/6552* (2013.01)

(58) Field of Classification Search
CPC ......... H03M 13/1102; H03M 13/1105; H03M 13/616; H03M 13/6552; H04L 1/0057
USPC .......... 714/752, 758, 776, 800, 801
See application file for complete search history.

(56) References Cited

U.S. PATENT DOCUMENTS

| | | | |
|---|---|---|---|
| 2010/0146371 A1* | 6/2010 | Efimov | H03M 13/1111 714/780 |
| 2011/0283158 A1 | 11/2011 | Yang et al. | |
| 2013/0254617 A1 | 9/2013 | Shinohara et al. | |
| 2014/0157079 A1* | 6/2014 | Park | H03M 13/116 714/758 |
| 2015/0039973 A1* | 2/2015 | Jeong | H03M 13/11 714/776 |
| 2015/0082118 A1* | 3/2015 | Jeong | H03M 13/1165 714/758 |
| 2015/0082131 A1* | 3/2015 | Jeong | H04L 1/0071 714/776 |
| 2015/0089320 A1* | 3/2015 | Jeong | H03M 13/255 714/758 |
| 2015/0089321 A1* | 3/2015 | Myung | H03M 13/036 714/758 |
| 2015/0095744 A1* | 4/2015 | Jeong | H03M 13/2792 714/776 |
| 2015/0100844 A1* | 4/2015 | Park | H03M 13/1177 714/752 |
| 2015/0100845 A1* | 4/2015 | Myung | H03M 13/2778 714/752 |
| 2015/0121176 A1* | 4/2015 | Myung | H04L 1/0041 714/776 |
| 2015/0128005 A1* | 5/2015 | Jeong | H03M 13/036 714/752 |
| 2015/0214982 A1* | 7/2015 | Park | H04L 27/20 714/752 |
| 2015/0229328 A1* | 8/2015 | Park | H03M 13/6552 714/776 |
| 2015/0229334 A1* | 8/2015 | Park | H03M 13/2792 714/776 |
| 2015/0229335 A1* | 8/2015 | Park | H03M 13/2792 714/776 |
| 2015/0229336 A1* | 8/2015 | Park | H03M 13/2792 714/776 |
| 2015/0236720 A1* | 8/2015 | Park | H03M 13/116 714/752 |
| 2015/0236721 A1* | 8/2015 | Kim | H04L 1/0041 714/776 |
| 2015/0236722 A1* | 8/2015 | Park | H03M 13/036 714/776 |
| 2015/0236816 A1* | 8/2015 | Myung | H04L 1/0041 714/776 |
| 2015/0256202 A1* | 9/2015 | Park | H03M 13/1165 714/762 |
| 2015/0270853 A1* | 9/2015 | Jeong | H03M 13/2792 714/752 |
| 2015/0270854 A1* | 9/2015 | Park | H03M 13/036 714/776 |
| 2015/0280747 A1* | 10/2015 | Park | H03M 13/2778 714/752 |
| 2015/0339190 A1* | 11/2015 | Park | H03M 13/1102 714/766 |
| 2015/0339191 A1* | 11/2015 | Park | G06F 11/1076 714/766 |
| 2015/0341047 A1* | 11/2015 | Park | G06F 11/1076 714/766 |
| 2015/0341048 A1* | 11/2015 | Park | H03M 13/1102 714/766 |
| 2015/0341052 A1* | 11/2015 | Jeong | H03M 13/1102 714/776 |
| 2015/0341053 A1* | 11/2015 | Kim | H03M 13/1102 714/776 |
| 2015/0341054 A1* | 11/2015 | Myung | H03M 13/1102 714/776 |
| 2016/0013809 A1* | 1/2016 | Myung | H03M 13/1165 714/776 |

OTHER PUBLICATIONS

Yiyan Wu et al., "Cloud Transmission: A New Spectrum-Reuse Friendly Digital Terrestrial Broadcasting Transmission System", IEEE Transactions on Broadcasting, Sep. 2012, pp. 329-337, vol. 58, No. 3.

"Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Sep. 26, 2013, pp. 1-101, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Oct. 21, 2013, pp. 1-138, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Dec. 5, 2013, pp. 1-138, CRC Canada and ETRI Korea.

Yung-Sik Kwon, Declaration filed on Jun. 17, 2016 in related U.S. Appl. No. 14/496,457, in support of the cited document entitled "Proposal to the ATSC 3.0 PHY Layer CfP Cloud Transmission for the ATSC 3.0 PHY Layer".

* cited by examiner

LOW DENSITY PARITY CHECK ENCODER HAVING LENGTH OF 64800 AND CODE RATE OF 2/15, AND LOW DENSITY PARITY CHECK ENCODING METHOD USING THE SAME

CROSS-REFERENCE TO RELATED APPLICATIONS

This application is a continuation of U.S. patent application Ser. No. 15/271,169, filed on Sep. 20, 2016, which is a continuation of U.S. patent application Ser. No. 14/496,457, filed on Sep. 25, 2014, which claims the benefit of Korean Patent Application Nos. 10-2014-0106178 and 10-2014-0120012, filed Aug. 14, 2014 and Sep. 11, 2014, respectively, which are hereby incorporated by reference herein in their entirety.

BACKGROUND

1. Technical Field

The present disclosure relates generally to a low density parity check (LDPC) code that is used to correct errors occurring over a wireless channel, and, more particularly, to an LDPC code that is applicable to a digital broadcasting system.

2. Description of the Related Art

Current terrestrial television (TV) broadcasting generates co-channel interference across an area within a distance that is three times a service radius, and thus the same frequency cannot be reused in the area within the distance that is three times the service radius. An area in which the same frequency cannot be reused is called a white space. Spectrum efficiency significantly deteriorates due to the occurrence of a white space.

Accordingly, there arises a need for the development of a transmission technology that facilitates the elimination of a white space and the reuse of a frequency with an emphasis on reception robustness in order to improve spectrum efficiency.

In response to this, the paper "Cloud Transmission: A New Spectrum-Reuse Friendly Digital Terrestrial Broadcasting Transmission System" published on September of 2012 in IEEE Transactions on Broadcasting, Vol. 58, No. 3 proposes a terrestrial cloud transmission technology that facilitates reuse, does not generate a white space, and makes the construction and operation of a single frequency network easy.

Using this terrestrial cloud transmission technology, a broadcasting station can transmit the same nationwide content or locally different content over a single broadcasting channel. However, for this purpose, a receiver should receive one or more terrestrial cloud broadcast signals in an area in which signals transmitted from different transmitters overlap each other, that is, an overlap area, over a single frequency network, and then should distinguish and demodulate the received terrestrial cloud broadcast signals. That is, the receiver should demodulate one or more cloud broadcast signals in a situation in which co-channel interference is present and the timing and frequency synchronization between transmitted signals are not guaranteed.

Meanwhile, Korean Patent Application Publication No. 2013-0135746 entitled "Low Density Parity Check Code for Terrestrial Cloud Transmission" discloses an LDPC code that is optimized for terrestrial cloud transmission and exhibits excellent performance at low code rate (<0.5).

However, Korean Patent Application Publication No. 2013-0135746 is directed to a code length completely different from an LDPC code length used in the DVB broadcast standard, etc., and does not teach a specific LDPC encoding method.

SUMMARY

At least one embodiment of the present invention is directed to the provision of a new LDPC codeword having a length of 64800 and a code rate of 2/15, which is capable of being used for general purposes.

At least one embodiment of the present invention is directed to the provision of an LDPC encoding technique that is capable of efficiently performing LDPC encoding using a sequence having a number of rows equal to a value that is obtained by dividing the sum of the length of the systematic part of an LDPC codeword, that is, 8640, and the length of the first parity part of the LDPC codeword, that is, 1800, by 360.

In accordance with an aspect of the present invention, there is provided an LDPC encoder, including first memory configured to store an LDPC codeword having a length of 64800 and a code rate of 2/15; second memory configured to be initialized to 0; and a processor configured to generate the LDPC codeword corresponding to information bits by performing accumulation with respect to the second memory using a sequence corresponding to a parity check matrix (PCM).

The accumulation may be performed at parity bit addresses that are updated using the sequence corresponding to the PCM.

The LDPC codeword may include a systematic part corresponding to the information bits and having a length of 8640, a first parity part corresponding to a dual diagonal matrix included in the PCM and having a length of 1800, and a second parity part corresponding to an identity matrix included in the PCM and having a length of 54360.

The sequence may have a number of rows equal to the sum of a value obtained by dividing a length of the systematic part, that is, 8640, by a circulant permutation matrix (CPM) size corresponding to the PCM, that is, 360, and a value obtained by dividing a length of the first parity part, that is, 1800, by the CPM size.

The sequence may be represented by the following Sequence Table:

Sequence Table

1st row: 615 898 1029 6129 8908 10620 13378 14359 21964 23319 26427 26690 28128 33435 36080 40697 43525 44498 50994

2nd row: 165 1081 1637 2913 8944 9639 11391 17341 22000 23580 32309 38495 41239 44079 47395 47460 48282 51744 52782

3rd row: 426 1340 1493 2261 10903 13336 14755 15244 20543 29822 35283 38846 45368 46642 46934 48242 49000 49204 53370

4th row: 407 1059 1366 2004 5985 9217 9321 13576 19659 20808 30009 31094 32445 39094 39357 40651 44358 48755 49732

5th row: 692 950 1444 2967 3929 6951 10157 10326 11547 13562 19634 34484 38236 42918 44685 46172 49694 50535 55109

6th row: 1087 1458 1574 2335 3248 6965 17856 23454 25182 37359 37718 37768 38061 38728 39437 40710 46298 50707 51572

7th row: 1098 1540 1711 7723 9549 9986 16369 19567 21185 21319 25750 32222 32463 40342 41391 43869 48372 52149 54722

8th row: 514 1283 1635 6602 11333 11443 17690 21036 22936 24525 25425 27103 28733 29551 39204 42525 49200 54899 54961

9th row: 357 609 1096 2954 4240 5397 8425 13974 15252 20167 20362 21623 27190 42744 47819 49096 51995 55504 55719

10th row: 25 448 1501 11572 13478 24338 29198 29840 31428 33088 34724 37698 37988 38297 40482 46953 47880 53751 54943

11st row: 328 1096 1262 10802 12797 16053 18038 20433 20444 25422 32992 34344 38326 41435 46802 48766 49807 52966 55751

12nd row: 34 790 987 5082 5788 10778 12824 18217 23278 24737 28312 34464 36765 37999 39603 40797 43237 53089 55319

13rd row: 226 1149 1470 3483 8949 9312 9773 13271 17804 20025 20323 30623 38575 39887 40305 46986 47223 49998 52111

14th row: 1088 1091 1757 2682 5526 5716 9665 10733 12997 14440 24665 27990 30203 33173 37423 38934 40494 45418 48393

15th row: 809 1278 1580 3486 4529 6117 6212 6823 7861 9244 11559 20736 30333 32450 35528 42968 44485 47149 54913

16th row: 369 525 1622 2261 6454 10483 11259 16461 17031 20221 22710 25137 26622 27904 30884 31858 44121 50690 56000

17th row: 423 1291 1352 7883 26107 26157 26876 27071 31515 35340 35953 36608 37795 37842 38527 41720 46206 47998 53019

18th row: 540 662 1433 2828 14410 22880 24263 24802 28242 28396 35928 37214 39748 43915 44905 46590 48684 48890 55926

19th row: 214 1291 1622 7311 8985 20952 22752 23261 24896 25057 28826 37074 37707 38742 46026 51116 51521 52956 54213

20th row: 109 1305 1676 2594 7447 8943 14806 16462 19730 23430 24542 34300 36432 37133 41199 43942 45860 47598 48401 49407

21st row: 242 388 1360 6721 14220 21029 22536 25126 32251 33182 39192 42436 44144 45252 46238 47369 47607 47695 50635 51469

22nd row: 199 958 1111 13661 18809 19234 21459 25221 25837 28256 36919 39031 39107 39262 43572 45018 45959 48006 52387 55811

23rd row: 668 1087 1451 2945 3319 12519 21248 21344 22627 22701 28152 29670 31430 32655 38533 42233 43200 44013 44459 51398

24th row: 244 1133 1665 8222 8740 11285 12774 15922 20147 20978 28927 35086 40197 40583 41066 41223 42104 44650 45391 48437

25th row: 5623 8050 9679 12978 15846 16049 21807 23364 27226 27758 28661 38147 46337 48141 51364 51927 55124

26th row: 10369 13704 14491 18632 19430 21218 33392 36182 36722 37342 37415 46322 47449 51136 53392 54356 55108

27th row: 7460 9411 11132 11739 13722 15501 25588 26463 26738 31980 31981 35002 39659 39783 41581 51358 55114

28th row: 8915 15253 15264 16513 16896 18367 19110 23492 32074 33302 42443 43797 44715 47538 48515 53464 53548

29th row: 5884 8910 10123 11311 13654 14207 16122 18113 23100 23784 24825 39629 46372 52454 52799 55039 55973

The accumulation may be performed while the rows of the sequence are being repeatedly changed by the CPM size of the PCM.

In accordance with an aspect of the present invention, there is provided an LDPC encoding method, including initializing first memory configured to store an LDPC codeword having a length of 64800 and a code rate of 2/15 and second memory; and generating the LDPC codeword corresponding to information bits by performing accumulation with respect to the second memory using a sequence corresponding to a PCM.

The accumulation may be performed at parity bit addresses that are updated using the sequence corresponding to the PCM.

The LDPC codeword may include a systematic part corresponding to the information bits and having a length of 8640, a first parity part corresponding to a dual diagonal matrix included in the PCM and having a length of 1800, and a second parity part corresponding to an identity matrix included in the PCM and having a length of 54360.

The sequence may have a number of rows equal to the sum of a value obtained by dividing a length of the systematic part, that is, 8640, by a circulant permutation matrix (CPM) size corresponding to the PCM, that is, 360, and a value obtained by dividing a length of the first parity part, that is, 1800, by the CPM size.

The sequence may be represented by the above Sequence Table.

In accordance with still another aspect of the present invention, there is provided an LDPC decoder, including a receiving unit configured to receive an LDPC codeword encoded using a sequence corresponding to a PCM and is represented by the above Sequence Table; and a decoding unit configured to restore information bits from the received LDPC codeword by performing decoding corresponding to the PCM.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
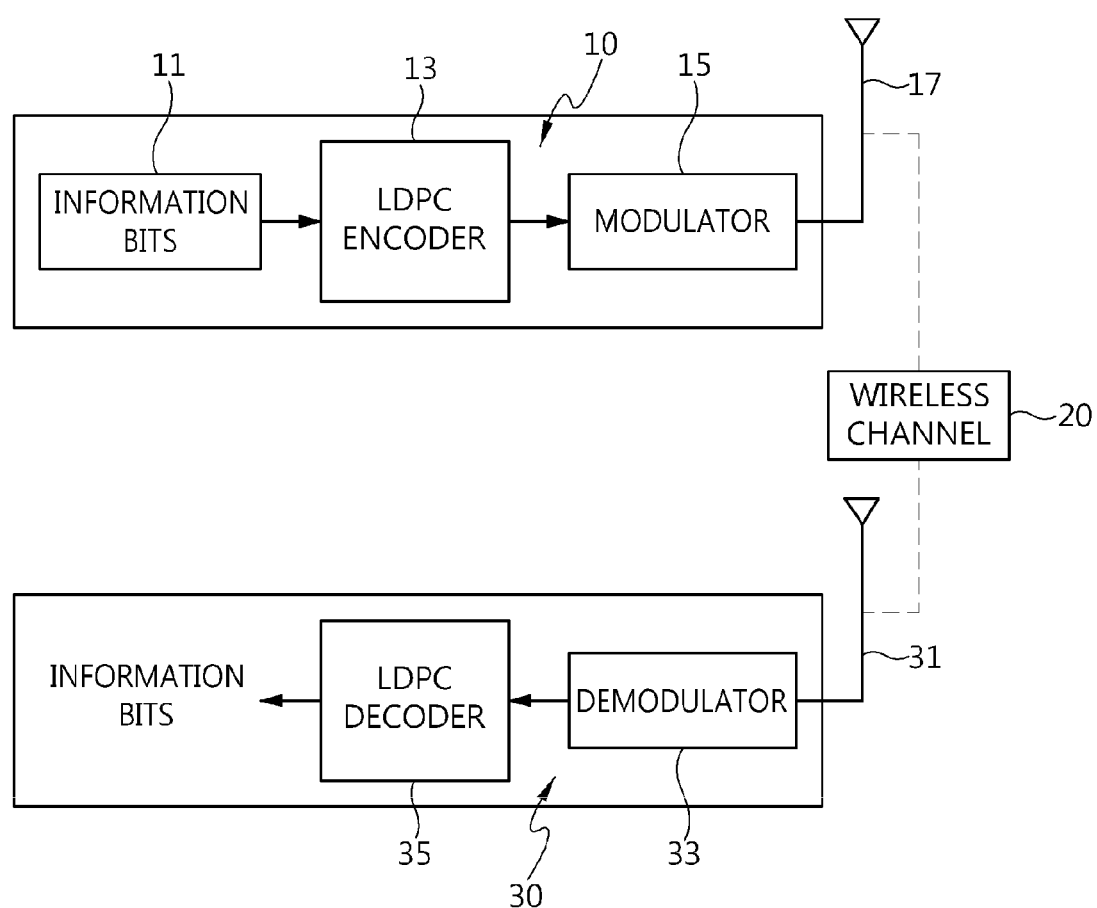
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a transmitter 10 and a receiver 30 communicate with each other over a wireless channel 20.

The transmitter 10 generates an n-bit codeword by encoding k information bits using an LDPC encoder 13. The codeword is modulated by the modulator 15, and is transmitted via an antenna 17. The signal transmitted via the wireless channel 20 is received via the antenna 31 of the receiver 30, and, in the receiver 30, is subjected to a process reverse to the process in the transmitter 10. That is, the received data is demodulated by a demodulator 33, and is then decoded by an LDPC decoder 35, thereby finally restoring the information bits.

It will be apparent to those skilled in the art that the above-described transmission and reception processes have been described within a minimum range required for a description of the features of the present invention and various processes required for data transmission may be added.

In the following, the specific processes of encoding and decoding that are performed using an LDPC code in the LDPC encoder 13 or LDPC decoder 35 and the specific configurations of encoding and decoding devices, such as the LDPC encoder 13 and the LDPC decoder 35, are described. The LDPC encoder 13 illustrated in FIG. 1 may have a structure illustrated in FIG. 4, and the LDPC decoder 35 may have a structure illustrated in FIG. 5.

Figure 2:
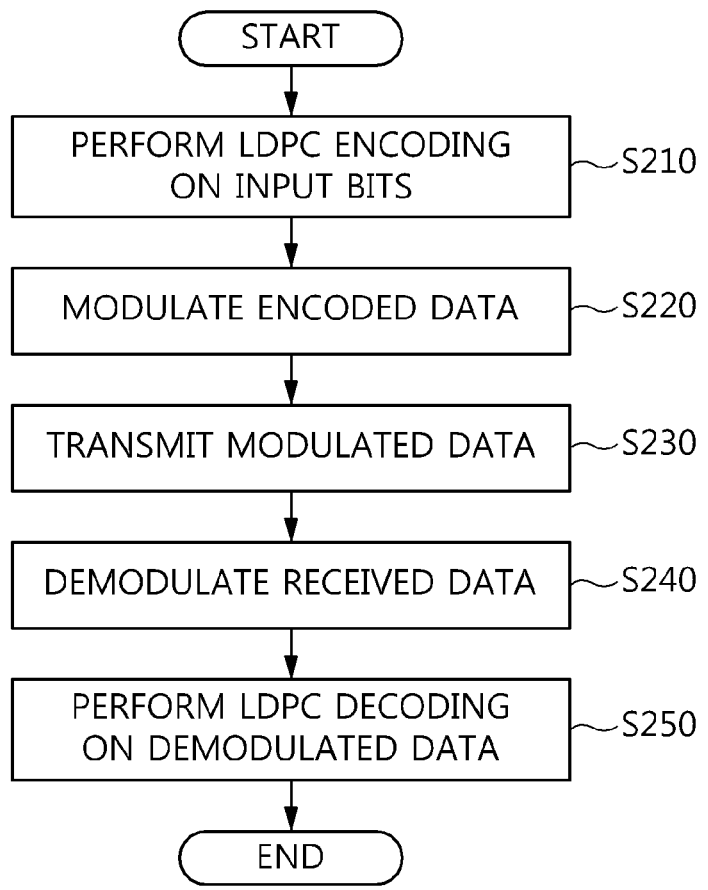
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to LDPC encoding at step S210.

That is, at step S210, an n-bit codeword is generated by encoding k information bits using the LDPC encoder.

Figure 6:
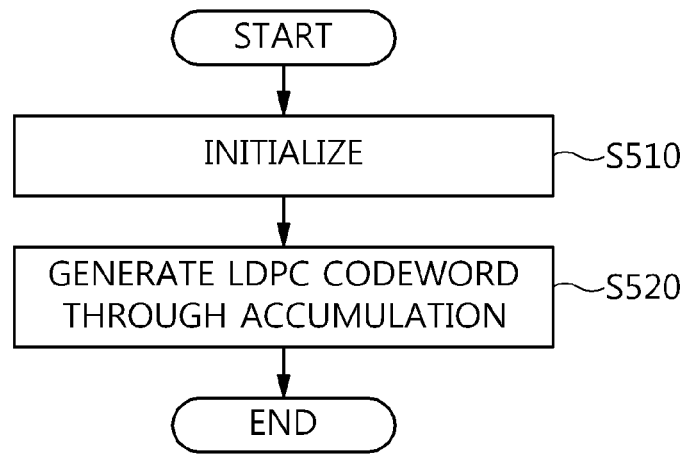
FIG. 6 is an operation flowchart illustrating an LDPC encoding method according to an embodiment of the present invention.

In this case, step S210 may be performed as in an LDPC encoding method illustrated in FIG. 6.

Furthermore, in the broadcast signal transmission and reception method, the encoded data is modulated at step S220.

That is, at step S220, the encoded n-bit codeword is modulated using the modulator.

Furthermore, in the broadcast signal transmission and reception method, the modulated data is transmitted at step S230.

That is, at step S230, the modulated codeword is transmitted over a wireless channel via the antenna.

Furthermore, in the broadcast signal transmission and reception method, the received data is demodulated at step S240.

That is, at step S240, the signal transmitted over the wireless channel is received via the antenna of the receiver, and the received data is demodulated using the demodulator.

Furthermore, in the broadcast signal transmission and reception method, the demodulated data is subjected to LDPC decoding at step S250.

That is, at step S250, the information bits are finally restored by performing LDPC decoding using the demodulator of the receiver.

Figure 5:
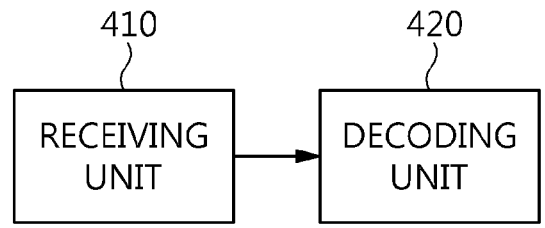
FIG. 5 is a block diagram illustrating an LDPC decoder according to an embodiment of the present invention.

In this case, step S250 corresponds to a process reverse to that of the LDPC encoding method illustrated in FIG. 6, and may correspond to the LDPC decoder of FIG. 5.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
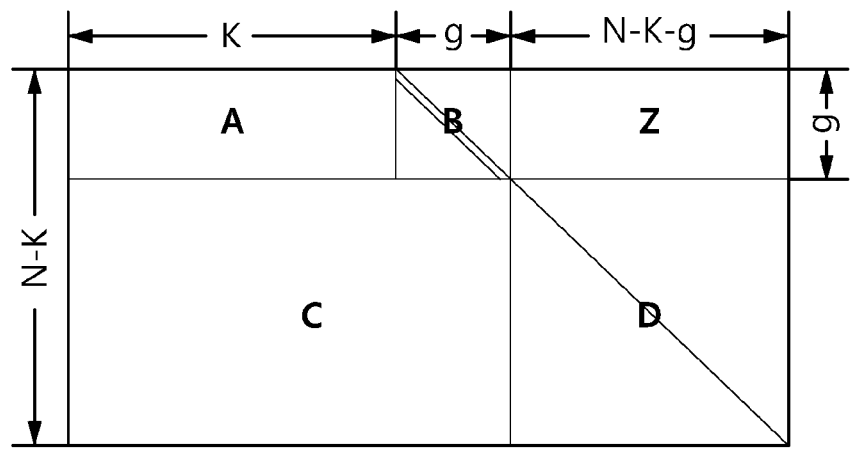
FIG. 3 is a diagram illustrating the structure of a PCM corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)× (N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 2/15 and the length of a codeword is 64800, as illustrated in the following Table 1. That is, the present invention proposes an LDPC code that is designed to receive information having a length of 8640 and generate an LDPC codeword having a length of 64800.

Table 1 illustrates the sizes of the matrices A, B, C, D and Z of the QC-LDPC code according to the present invention:

TABLE 1

| | | Sizes | | | | |
|---|---|---|---|---|---|---|
| Code rate | Length | A | B | C | D | Z |
| 2/15 | 64800 | 1800 × 8640 | 1800 × 1800 | 54360 × 10440 | 54360 × 54360 | 1800 × 54360 |

The newly designed LDPC code may be represented in the form of a sequence (progression), an equivalent relationship is established between the sequence and matrix (parity bit check matrix), and the sequence may be represented, as follows:

Sequence Table

1st row: 615 898 1029 6129 8908 10620 13378 14359 21964 23319 26427 26690 28128 33435 36080 40697 43525 44498 50994
2nd row: 165 1081 1637 2913 8944 9639 11391 17341 22000 23580 32309 38495 41239 44079 47395 47460 48282 51744 52782
3rd row: 426 1340 1493 2261 10903 13336 14755 15244 20543 29822 35283 38846 45368 46642 46934 48242 49000 49204 53370
4th row: 407 1059 1366 2004 5985 9217 9321 13576 19659 20808 30009 31094 32445 39094 39357 40651 44358 48755 49732
5th row: 692 950 1444 2967 3929 6951 10157 10326 11547 13562 19634 34484 38236 42918 44685 46172 49694 50535 55109
6th row: 1087 1458 1574 2335 3248 6965 17856 23454 25182 37359 37718 37768 38061 38728 39437 40710 46298 50707 51572
7th row: 1098 1540 1711 7723 9549 9986 16369 19567 21185 21319 25750 32222 32463 40342 41391 43869 48372 52149 54722
8th row: 514 1283 1635 6602 11333 11443 17690 21036 22936 24525 25425 27103 28733 29551 39204 42525 49200 54899 54961
9th row: 357 609 1096 2954 4240 5397 8425 13974 15252 20167 20362 21623 27190 42744 47819 49096 51995 55504 55719
10th row: 25 448 1501 11572 13478 24338 29198 29840 31428 33088 34724 37698 37988 38297 40482 46953 47880 53751 54943
11st row: 328 1096 1262 10802 12797 16053 18038 20433 20444 25422 32992 34344 38326 41435 46802 48766 49807 52966 55751
12nd row: 34 790 987 5082 5788 10778 12824 18217 23278 24737 28312 34464 36765 37999 39603 40797 43237 53089 55319
13rd row: 226 1149 1470 3483 8949 9312 9773 13271 17804 20025 20323 30623 38575 39887 40305 46986 47223 49998 52111
14th row: 1088 1091 1757 2682 5526 5716 9665 10733 12997 14440 24665 27990 30203 33173 37423 38934 40494 45418 48393
15th row: 809 1278 1580 3486 4529 6117 6212 6823 7861 9244 11559 20736 30333 32450 35528 42968 44485 47149 54913
16th row: 369 525 1622 2261 6454 10483 11259 16461 17031 20221 22710 25137 26622 27904 30884 31858 44121 50690 56000
17th row: 423 1291 1352 7883 26107 26157 26876 27071 31515 35340 35953 36608 37795 37842 38527 41720 46206 47998 53019
18th row: 540 662 1433 2828 14410 22880 24263 24802 28242 28396 35928 37214 39748 43915 44905 46590 48684 48890 55926
19th row: 214 1291 1622 7311 8985 20952 22752 23261 24896 25057 28826 37074 37707 38742 46026 51116 51521 52956 54213
20th row: 109 1305 1676 2594 7447 8943 14806 16462 19730 23430 24542 34300 36432 37133 41199 43942 45860 47598 48401 49407
21st row: 242 388 1360 6721 14220 21029 22536 25126 32251 33182 39192 42436 44144 45252 46238 47369 47607 47695 50635 51469
22nd row: 199 958 1111 13661 18809 19234 21459 25221 25837 28256 36919 39031 39107 39262 43572 45018 45959 48006 52387 55811
23rd row: 668 1087 1451 2945 3319 12519 21248 21344 22627 22701 28152 29670 31430 32655 38533 42233 43200 44013 44459 51398
24th row: 244 1133 1665 8222 8740 11285 12774 15922 20147 20978 28927 35086 40197 40583 41066 41223 42104 44650 45391 48437
25th row: 5623 8050 9679 12978 15846 16049 21807 23364 27226 27758 28661 38147 46337 48141 51364 51927 55124
26th row: 10369 13704 14491 18632 19430 21218 33392 36182 36722 37342 37415 46322 47449 51136 53392 54356 55108

27th row: 7460 9411 11132 11739 13722 15501 25588 26463 26738 31980 31981 35002 39659 39783 41581 51358 55114

28th row: 8915 15253 15264 16513 16896 18367 19110 23492 32074 33302 42443 43797 44715 47538 48515 53464 53548

29th row: 5884 8910 10123 11311 13654 14207 16122 18113 23100 23784 24825 39629 46372 52454 52799 55039 55973

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j = 0 \text{ for } j=0,1,\ldots,M_1+M_2-1 \quad (4)$$

First information bit $\lambda_0$ is accumulated at parity bit addresses specified in the 1st row of the sequence of the Sequence Table. For example, in an LDPC code having a length of 64800 and a code rate of 2/15, an accumulation process is as follows:

$$p_{615} = p_{615} \oplus \lambda_0 \quad p_{898} = p_{898} \oplus \lambda_0 \quad p_{1029} = p_{1029} \oplus \lambda_0 \quad p_{6129} = p_{6129} \oplus \lambda_0 \quad p_{8908} = p_{8908} \oplus \lambda_0$$

$$p_{10620} = p_{10620} \oplus \lambda_0 \quad p_{13378} = p_{13378} \oplus \lambda_0 \quad p_{14359} = p_{14359} \oplus \lambda_0 \quad p_{21964} = p_{21964} \oplus \lambda_0 \quad p_{23319} = p_{23319} \oplus \lambda_0$$

$$p_{26427} = p_{26427} \oplus \lambda_0 \quad p_{26690} = p_{26690} \oplus \lambda_0 \quad p_{28128} = p_{28128} \oplus \lambda_0 \quad p_{33435} = p_{33435} \oplus \lambda_0 \quad p_{36080} = p_{36080} \oplus \lambda_0$$

$$p_{40697} = p_{40697} \oplus \lambda_0 \quad p_{43525} = p_{43525} \oplus \lambda_0 \quad p_{44498} = p_{44498} \oplus \lambda_0 \quad p_{50994} = p_{50994} \oplus \lambda_0$$

where the addition $\oplus$ occurs in GF(2).

The subsequent L−1 information bits, that is, $\lambda_m$, m=1, 2, . . . , L−1, are accumulated at parity bit addresses that are calculated by the following Equation 5:

$$(x+m \times Q_1) \bmod M_1 \text{ if } x < M_1$$

$$M_1 + \{(x-M_1+m \times Q_2) \bmod M_2\} \text{ if } x \geq M_1 \quad (5)$$

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and L=360. Furthermore, $Q_1$ and $Q_2$ are defined in the following Table 2. For example, for an LDPC code having a length of 64800 and a code rate of 2/15, $M_1=1800$, $Q_1=5$, $M_2=54360$, $Q_2=151$ and L=360, and the following operations are performed on the second bit $\lambda_1$ using Equation 5:

Table 2 illustrates the sizes of $M_1$, $Q_1$, $M_2$ and $Q_2$ of the designed QC-LDPC code:

TABLE 2

| Code rate | Length | $M_1$ | $M_2$ | $Q_1$ | $Q_2$ |
|---|---|---|---|---|---|
| 2/15 | 64800 | 1800 | 54360 | 5 | 151 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i = p_i \oplus p_{i-1} \text{ for } i=0, 1, \ldots, M_1-1 \quad (6)$$

Thereafter, when a parity interleaving operation, such as that of the following Equation 7, is performed, parity bits corresponding to the dual diagonal matrix B are generated:

$$\lambda_{K+L \cdot t+s} = p_{Q_1 \cdot s+t} \text{ for } 0 \leq s < L, 0 \leq t < Q_1 \quad (7)$$

When the parity bits corresponding to the dual diagonal matrix B have been generated using K information bits $\lambda_0$, $\lambda_1, \ldots, \lambda_{K-1}$, parity bits corresponding to the identity matrix D are generated using the $M_1$ generated parity bits $\lambda_K, \lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L \cdot t+s} = p_{M_1+Q_2 \cdot s+t} \text{ for } 0 \leq s < L, 0 \leq t < Q_2 \quad (8)$$

$$p_{620} = p_{620} \oplus \lambda_1 \quad p_{903} = p_{903} \oplus \lambda_1 \quad p_{1034} = p_{1034} \oplus \lambda_1 \quad p_{6280} = p_{6280} \oplus \lambda_1 \quad p_{9059} = p_{9059} \oplus \lambda_1$$

$$p_{10771} = p_{10771} \oplus \lambda_1 \quad p_{13529} = p_{13529} \oplus \lambda_1 \quad p_{14510} = p_{14510} \oplus \lambda_1 \quad p_{22115} = p_{22115} \oplus \lambda_1 \quad p_{23470} = p_{23470} \oplus \lambda_1$$

$$p_{26578} = p_{26578} \oplus \lambda_1 \quad p_{26841} = p_{26841} \oplus \lambda_1 \quad p_{28279} = p_{28279} \oplus \lambda_1 \quad p_{33586} = p_{33586} \oplus \lambda_1 \quad p_{36231} = p_{36231} \oplus \lambda_1$$

$$p_{40848} = p_{40848} \oplus \lambda_1 \quad p_{43676} = p_{43676} \oplus \lambda_1 \quad p_{44649} = p_{44649} \oplus \lambda_1 \quad p_{51145} = p_{51145} \oplus \lambda_1$$

Figure 4:
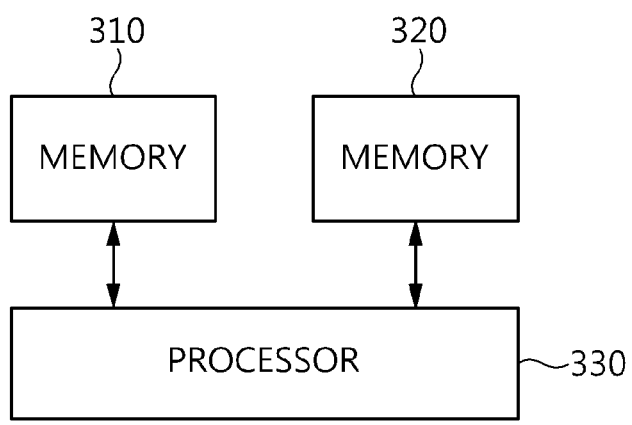
FIG. 4 is a block diagram illustrating an LDPC encoder according to an embodiment of the present invention.

FIG. 4 is a block diagram illustrating an LDPC encoder according to an embodiment of the present invention.

Referring to FIG. 4, the LDPC encoder according to this embodiment of the present invention includes memory 310 and 320 and a processor 330.

The memory 310 is memory that is used to store an LDPC codeword having a length of 64800 and a code rate of 2/15.

The memory 320 is memory that is initialized to 0.

The memory 310 and the memory 320 may correspond to $\lambda_i$ (i=0, 1, . . . , N−1) and $p_j$ (j=0, 1, . . . , $M_1+M_2-1$), respectively.

The memory 310 and the memory 320 may correspond to various types of hardware for storing sets of bits, and may correspond to data structures, such as an array, a list, a stack and a queue.

The processor 330 generates an LDPC codeword corresponding to information bits by performing accumulation with respect to the memory 320 using a sequence corresponding to a PCM.

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 8640 (=K), a first parity part $\lambda_K, \lambda_{K+1}, \ldots, \lambda_{K+M_1-1}$ corresponding to a dual diagonal matrix included in the PCM and having a length of 1800 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 54360 (=$M_2$).

In this case, the sequence may have a number of rows equal to the sum (8640/360+1800/360=29) of a value obtained by dividing the length of the systematic part, that is, 8640, by a CPM size L corresponding to the PCM, that is, 360, and a value obtained by dividing the length $M_1$ of the first parity part, that is, 1800, by 360.

As described above, the sequence may be represented by the above Sequence Table.

In this case, the memory 320 may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1$/L, $M_1$ may be the size of the first parity part, $Q_2$ may be $M_2$/L, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

FIG. 5 is a block diagram illustrating an LDPC decoder according to an embodiment of the present invention.

Referring to FIG. 5, the LDPC decoder according to this embodiment of the present invention may include a receiving unit 410 and a decoding unit 420.

The receiving unit 410 receives an LDPC codeword that has been encoded using a sequence that corresponds to a PCM and is represented by the above Sequence Table.

The decoding unit 420 restores information bits from the received LDPC codeword by performing decoding corresponding to the PCM.

In this case, the sequence may be used to update the parity bit addresses of the memory, and the parity bit addresses are used for accumulation that is performed to generate parity bits corresponding to the LDPC codeword.

In this case, the LDPC codeword may include a systematic part $\lambda_0, \lambda_1, \ldots, \lambda_{K-1}$ corresponding to the information bits, a first parity part $\lambda_K, \lambda_{K+1}, \ldots, \lambda_{K+M_1-1}$ corresponding to a dual diagonal matrix included in the PCM, and a second parity part $\lambda_{K+M_1}, \lambda_{K+M_1+1}, \ldots, \lambda_{K+M_1+M_2-1}$ corresponding to an identity matrix included in the PCM.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1$/L, $M_1$ may be the size of the first parity part, $Q_2$ may be $M_2$/L, and $M_2$ may be the size of the second parity part.

FIG. 6 is an operation flowchart illustrating an LDPC encoding method according to an embodiment of the present invention.

Referring to FIG. 6, the LDPC encoding method according to this embodiment of the present invention initializes the first memory that stores an LDPC codeword having a length of 64800 and a code rate of 2/15, and second memory at step S510.

In this case, step S510 may be performed using Equation 4.

Furthermore, in the LDPC encoding method according to this embodiment of the present invention, an LDPC codeword corresponding to information bits is generated by performing accumulation with respect to the second memory using a sequence corresponding to a PCM at step S520.

In this case, the accumulation may be performed at parity bit addresses that are updated using the sequence corresponding to the PCM.

In this case, the LDPC codeword may include a systematic part $\lambda_0, \lambda_1, \ldots, \lambda_{K-1}$ corresponding to the information bits and having a length of 8640 (=K), a first parity part $\lambda_K, \lambda_{K+1}, \ldots, \lambda_{K+M_1-1}$ corresponding to a dual diagonal matrix included in the PCM and having a length of 1800 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 54360 (=$M_2$).

In this case, the sequence may have a number of rows equal to the sum (8640/360+1800/360=29) of a value obtained by dividing the length of the systematic part, that is, 8640, by a CPM size L corresponding to the PCM, that is, 360, and a value obtained by dividing the length $M_1$ of the first parity part, that is, 1800, by 360.

As described above, the sequence may be represented by the above Sequence Table.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 7:
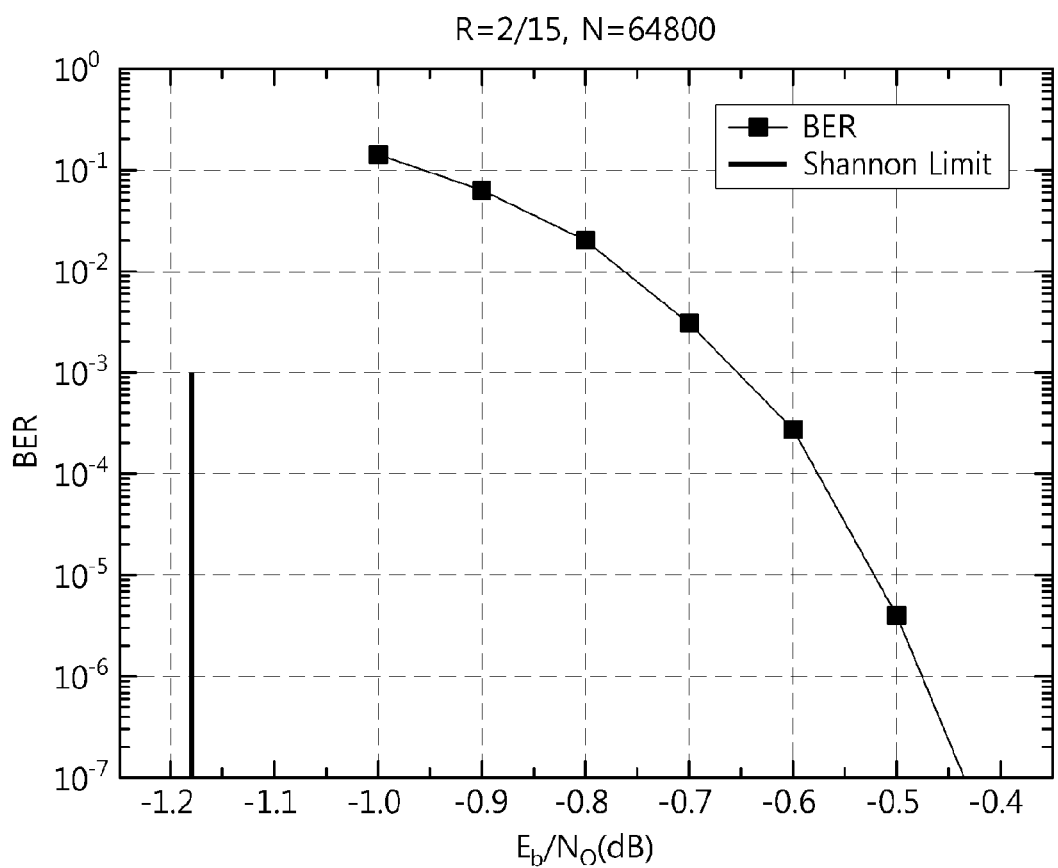
FIG. 7 is a graph plotting the performance of a QC-LDPC code having a length of 64800 and a code rate of 2/15 according to an embodiment of the present invention against $E_b/N_o$.

FIG. 7 is a graph plotting the performance of a QC-LDPC code having a length of 64800 and a code rate of 2/15 according to an embodiment of the present invention against $E_b/N_o$.

The graph illustrated in FIG. 7 illustrates results that were obtained on the assumption that a log-likelihood ratio (LLR)-based sum-product algorithm in which binary phase shift keying (BPSK) modulation and 50 rounds of repetitive decoding were performed was used for computational experiments. As illustrated in FIG. 7, it can be seen that the designed code is away from the Shannon limit by about 0.7 dB at BER=$10^{-6}$.

At least one embodiment of the present invention has the advantage of providing a new LDPC codeword having a length of 64800 and a code rate of 2/15, which is capable of being used for general purposes.

At least one embodiment of the present invention has the advantage of providing an LDPC encoding technique that is capable of efficiently performing LDPC encoding using a sequence having a number of rows equal to a value that is obtained by dividing the sum of the length of the systematic part of an LDPC codeword, that is, 8640, and the length of the first parity part of the LDPC codeword, that is, 1800, by 360.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A transmitter for a broadcast signal, comprising:
an LDPC encoder configured to generate an LDPC codeword having a length of 64800 and a code rate of 2/15 by performing accumulation with respect to memory initialized to 0, using a sequence corresponding to a parity check matrix (PCM), the LDPC codeword corresponding to information bits;
a modulator configured to perform modulation corresponding to the LDPC codeword in order to generate a modulated signal; and
an antenna configured to broadcast a transmission signal corresponding to the modulated signal over a physical channel to a reception device, the broadcasted transmission signal being an electromagnetic signal having a radio frequency,
wherein the LDPC codeword includes parity bits for correcting errors over the physical channel, and
wherein the sequence is represented by the following Sequence Table:

Sequence Table
1st row: 615 898 1029 6129 8908 10620 13378 14359 21964 23319 26427 26690 28128 33435 36080 40697 43525 44498 50994
2nd row: 165 1081 1637 2913 8944 9639 11391 17341 22000 23580 32309 38495 41239 44079 47395 47460 48282 51744 52782
3rd row: 426 1340 1493 2261 10903 13336 14755 15244 20543 29822 35283 38846 45368 46642 46934 48242 49000 49204 53370
4th row: 407 1059 1366 2004 5985 9217 9321 13576 19659 20808 30009 31094 32445 39094 39357 40651 44358 48755 49732
5th row: 692 950 1444 2967 3929 6951 10157 10326 11547 13562 19634 34484 38236 42918 44685 46172 49694 50535 55109
6th row: 1087 1458 1574 2335 3248 6965 17856 23454 25182 37359 37718 37768 38061 38728 39437 40710 46298 50707 51572
7th row: 1098 1540 1711 7723 9549 9986 16369 19567 21185 21319 25750 32222 32463 40342 41391 43869 48372 52149 54722
8th row: 514 1283 1635 6602 11333 11443 17690 21036 22936 24525 25425 27103 28733 29551 39204 42525 49200 54899 54961
9th row: 357 609 1096 2954 4240 5397 8425 13974 15252 20167 20362 21623 27190 42744 47819 49096 51995 55504 55719
10th row: 25 448 1501 11572 13478 24338 29198 29840 31428 33088 34724 37698 37988 38297 40482 46953 47880 53751 54943
11st row: 328 1096 1262 10802 12797 16053 18038 20433 20444 25422 32992 34344 38326 41435 46802 48766 49807 52966 55751
12nd row: 34 790 987 5082 5788 10778 12824 18217 23278 24737 28312 34464 36765 37999 39603 40797 43237 53089 55319
13rd row: 226 1149 1470 3483 8949 9312 9773 13271 17804 20025 20323 30623 38575 39887 40305 46986 47223 49998 52111
14th row: 1088 1091 1757 2682 5526 5716 9665 10733 12997 14440 24665 27990 30203 33173 37423 38934 40494 45418 48393
15th row: 809 1278 1580 3486 4529 6117 6212 6823 7861 9244 11559 20736 30333 32450 35528 42968 44485 47149 54913
16th row: 369 525 1622 2261 6454 10483 11259 16461 17031 20221 22710 25137 26622 27904 30884 31858 44121 50690 56000
17th row: 423 1291 1352 7883 26107 26157 26876 27071 31515 35340 35953 36608 37795 37842 38527 41720 46206 47998 53019
18th row: 540 662 1433 2828 14410 22880 24263 24802 28242 28396 35928 37214 39748 43915 44905 46590 48684 48890 55926
19th row: 214 1291 1622 7311 8985 20952 22752 23261 24896 25057 28826 37074 37707 38742 46026 51116 51521 52956 54213

20th row: 109 1305 1676 2594 7447 8943 14806 16462 19730 23430 24542 34300 36432 37133 41199 43942 45860 47598 48401 49407

21st row: 242 388 1360 6721 14220 21029 22536 25126 32251 33182 39192 42436 44144 45252 46238 47369 47607 47695 50635 51469

22nd row: 199 958 1111 13661 18809 19234 21459 25221 25837 28256 36919 39031 39107 39262 43572 45018 45959 48006 52387 55811

23rd row: 668 1087 1451 2945 3319 12519 21248 21344 22627 22701 28152 29670 31430 32655 38533 42233 43200 44013 44459 51398

24th row: 244 1133 1665 8222 8740 11285 12774 15922 20147 20978 28927 35086 40197 40583 41066 41223 42104 44650 45391 48437

25th row: 5623 8050 9679 12978 15846 16049 21807 23364 27226 27758 28661 38147 46337 48141 51364 51927 55124

26th row: 10369 13704 14491 18632 19430 21218 33392 36182 36722 37342 37415 46322 47449 51136 53392 54356 55108

27th row: 7460 9411 11132 11739 13722 15501 25588 26463 26738 31980 31981 35002 39659 39783 41581 51358 55114

28th row: 8915 15253 15264 16513 16896 18367 19110 23492 32074 33302 42443 43797 44715 47538 48515 53464 53548

29th row: 5884 8910 10123 11311 13654 14207 16122 18113 23100 23784 24825 39629 46372 52454 52799 55039 55973.

2. The transmitter of claim 1, wherein the LDPC codeword comprises a systematic part corresponding to the information bits and having a length of 8640, a first parity part corresponding to a dual diagonal matrix included in the PCM and having a length of 1800, and a second parity part corresponding to an identity matrix included in the PCM and having a length of 54360.

3. The transmitter of claim 2, wherein the sequence has a number of rows equal to a sum of a value obtained by dividing a length of the systematic part, by a circulant permutation matrix (CPM) size corresponding to the PCM, and a value obtained by dividing a length of the first parity part, by the CPM size.

4. The transmitter of claim 3, wherein the accumulation is performed at parity bit addresses that are updated using the sequence.

5. The transmitter of claim 4, wherein the accumulation is performed while the rows of the sequence are being repeatedly changed by the CPM size of the PCM.

* * * * *